US006654668B1

(12) United States Patent
Harada et al.

(10) Patent No.: US 6,654,668 B1
(45) Date of Patent: Nov. 25, 2003

(54) PROCESSING APPARATUS, PROCESSING SYSTEM, DISTINGUISHING METHOD, AND DETECTING METHOD

(75) Inventors: Koji Harada, Kikuyo-Machi (JP); Hisakazu Nakayama, Kumamoto (JP); Jun Ookura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/502,580

(22) Filed: Feb. 11, 2000

(30) Foreign Application Priority Data

Feb. 16, 1999 (JP) .............................. 11-037725

(51) Int. Cl.[7] .............................................. G05D 23/00
(52) U.S. Cl. ...................... 700/299; 374/45; 219/444.1
(58) Field of Search ................................ 700/121, 299, 700/56, 57, 60, 66, 207, 208, 211, 300; 374/45; 414/936, 937; 219/444.1; 62/3.3; 118/724

(56) References Cited

U.S. PATENT DOCUMENTS

| 5,702,624 | A | * | 12/1997 | Liao et al. ............... 219/444.1 |
| 5,927,077 | A | * | 7/1999 | Hisai et al. .................. 62/3.3 |
| 6,191,394 | B1 | * | 2/2001 | Shirakawa et al. ...... 219/444.1 |
| 6,217,212 | B1 | * | 4/2001 | Brenninger et al. .......... 374/45 |

* cited by examiner

Primary Examiner—Leo Picard
Assistant Examiner—Steven R. Garland
(74) Attorney, Agent, or Firm—Rader, Fishman & Grauer PLLC

(57) ABSTRACT

The temperature of a hot plate is not more than a predetermined threshold when a wafer is accurately mounted at a substrate mounting position on the hot plate, whereas the temperature of the hot plate is the predetermined threshold when the wafer is not accurately mounted at the substrate mounting position on the hot plate. Therefore, when the temperature of the hot plate is not less than the predetermined threshold when the wafer is mounted on the hot plate, it is judged that the wafer is stranded on a guide, and an alarm is given by means of a speaker or a display section.

21 Claims, 15 Drawing Sheets

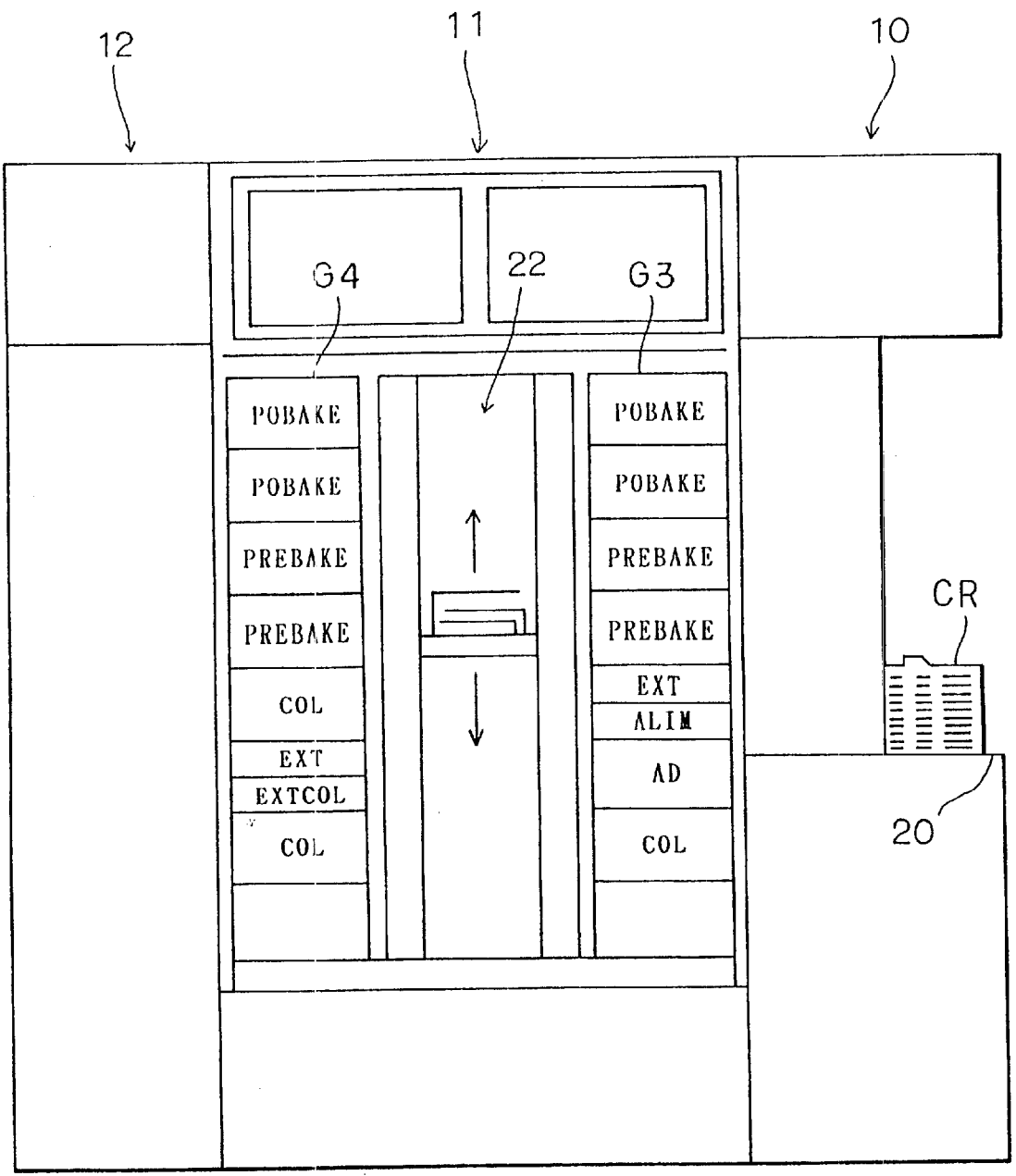
F I G. 3

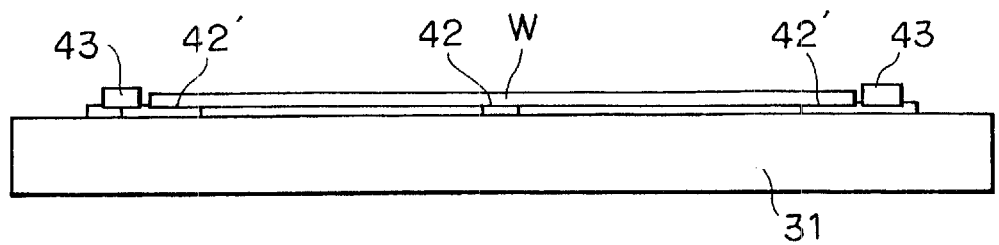
F I G. 8
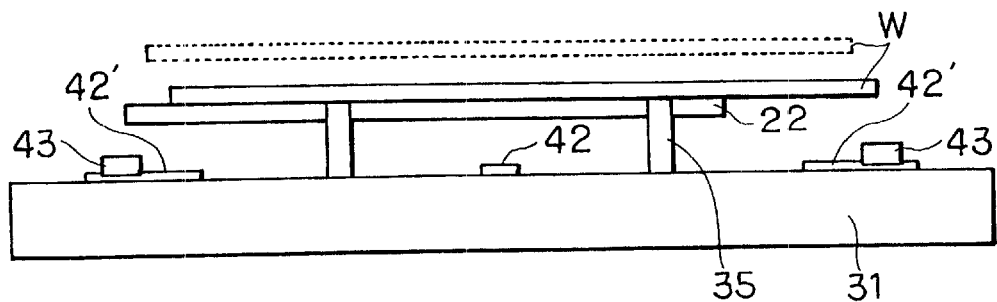
F I G. 9
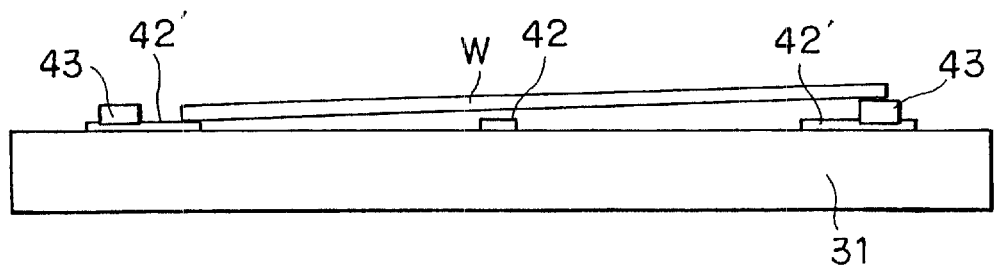
F I G. 10

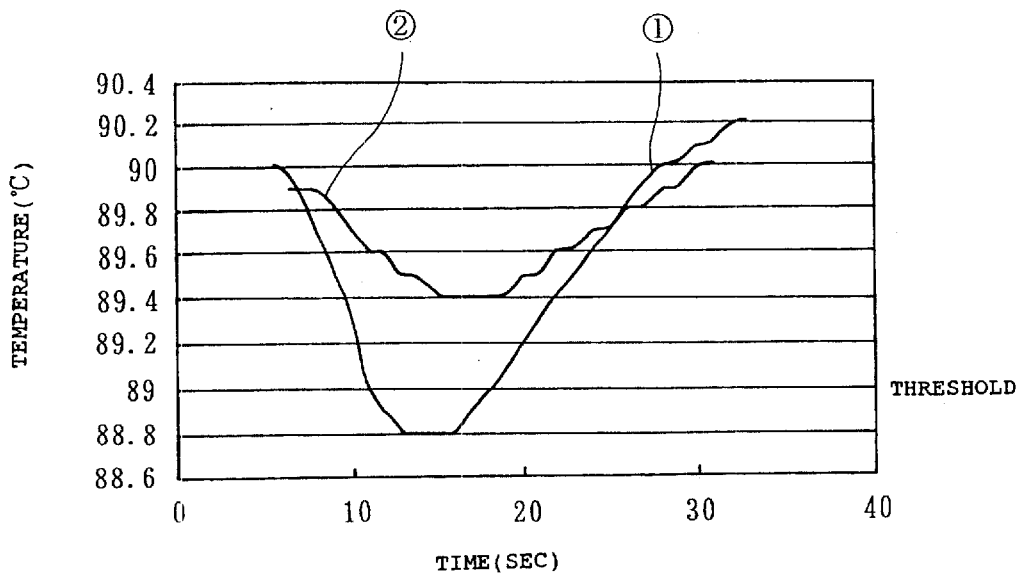
F I G. 1 1
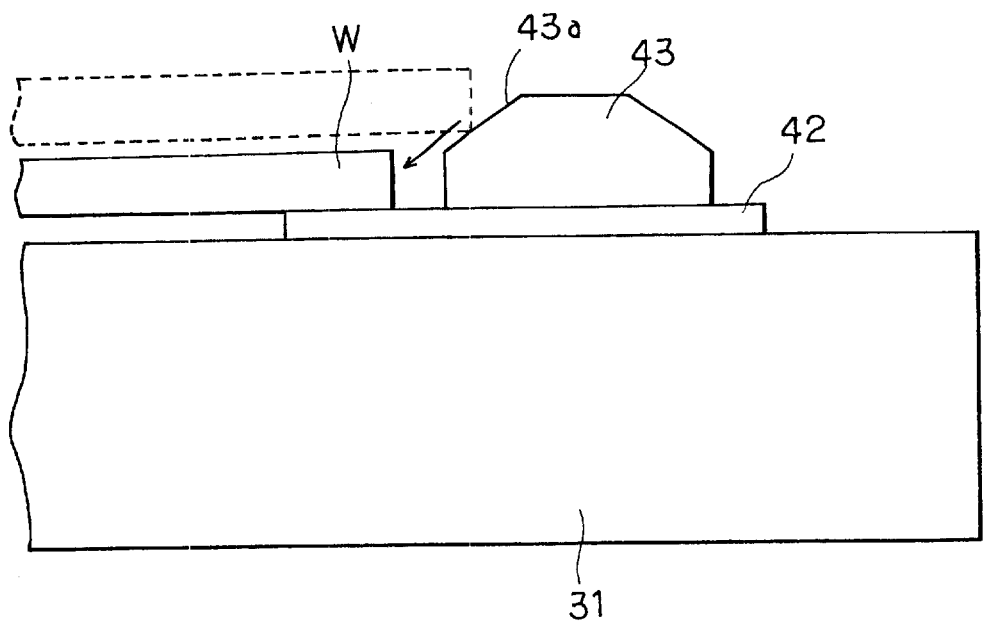
F I G. 1 2

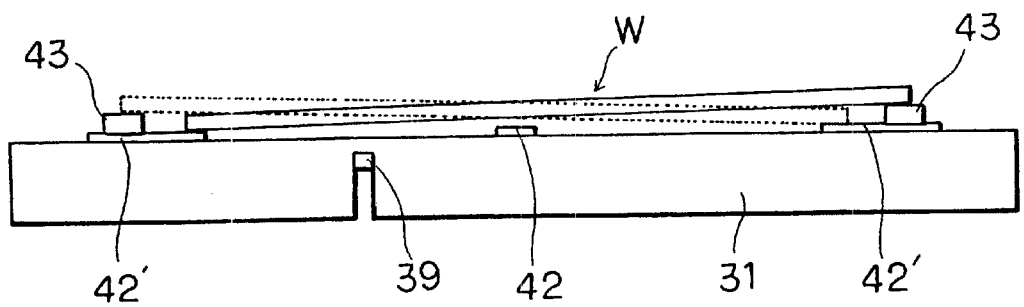
F I G. 1 3
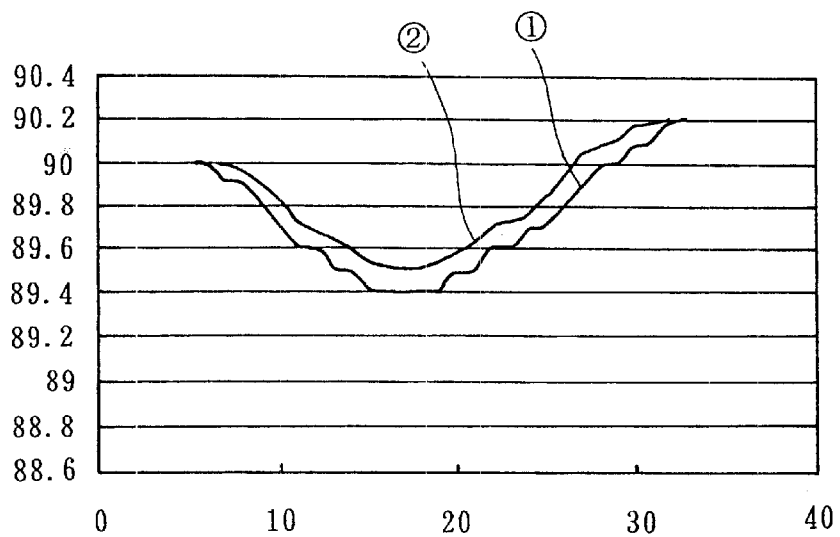
F I G. 1 4

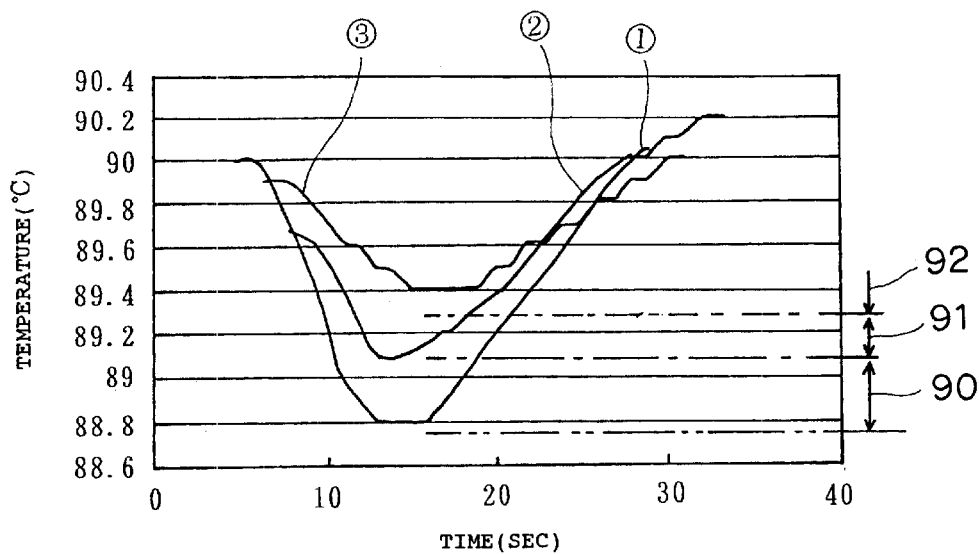
F I G. 2 0
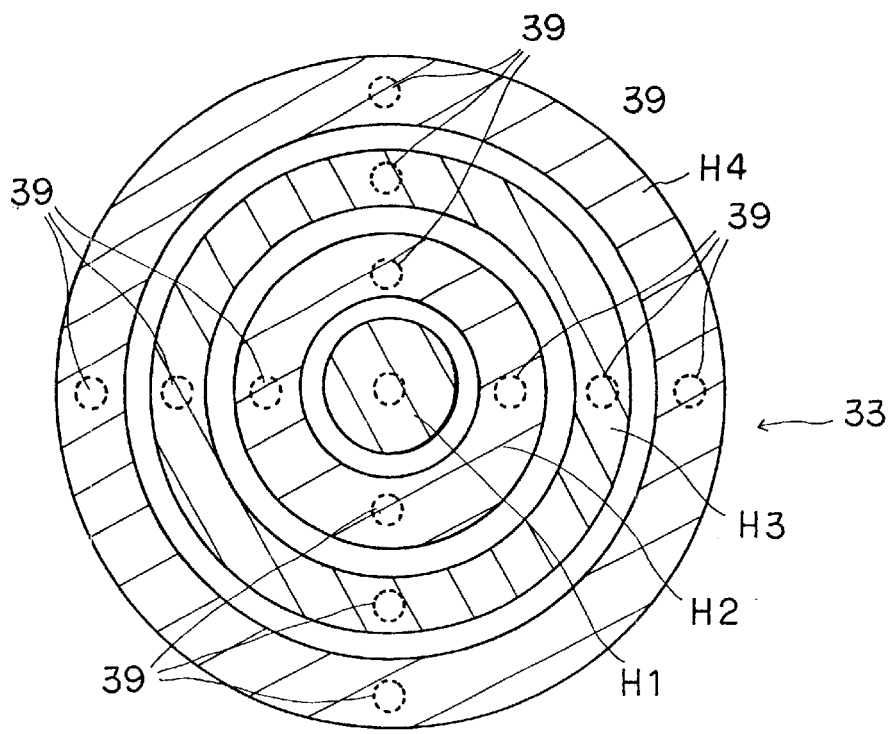
F I G. 2 1

PRIOR ART

PROCESSING APPARATUS, PROCESSING SYSTEM, DISTINGUISHING METHOD, AND DETECTING METHOD

BACKGROUND OF THE INVENTION

1. Field of the Invention

The present invention relates to a processing apparatus provided in an apparatus for performing resist coating and developing processing for a substrate, specially a semiconductor wafer or a substrate for an LCD, for example, or the like, for properly performing heat processing for the substrate, a processing system, a distinguishing method, and a detecting method.

2. Description of the Related Art

In this kind of coating and developing system, generally, after being coated with a resist, a substrate is transferred to an aligner, and the exposed substrate is received from the aligner to undergo developing processing. Before or after the exposure, heat processing or cooling processing is performed for the substrate.

FIG. 23 is a schematic front view of a heat processing unit for performing heat processing for a semiconductor wafer (hereinafter referred to only as "a wafer").

In FIG. 23, "101" denotes a hot plate for performing heat processing for a wafer W. A proximity pin 102 and proximity sheets 102' both for holding the wafer W while lifting it off the hot plate 101 are disposed on the hot plate 101, and a plurality of guides 105 each having a slant face 104 toward a wafer mounting position 103 nearly at the center of the hot plate 101 are provided to surround the wafer mounting position 103.

In this unit, a rise-and-fall pin (not illustrated) for receiving and sending the wafer W from/to a transfer device for transferring the wafer W in the system is disposed to freely protrude from and retract into the front face of the hot plate 101. The rise-and-fall pin receives the wafer W from the transfer device while protruding from the front face of the hot plate 101, and thereafter descends and retracts into the front face of the hot plate 101. Thus, the wafer W is mounted on the front face of the hot plate 101.

At this time, unless the transfer device delivers the wafer W to the rise-and-fall pin at an accurate position, the wafer W can not be mounted at an accurate mounting position of the wafer mounting position 103. Therefore, the guides 105 are provided as described above, whereby the wafer W is guided to the accurate mounting position of the wafer mounting position 103 by means of the guides 105 even when the transfer device delivers the wafer W to the rise-and-fall pin at a position slightly deviated.

SUMMARY OF THE INVENTION

However, when a position at which the transfer device delivers the wafer W to the rise-and-fall pin is considerably deviated, the wafer W is stranded on the guide 105, whereby heat processing is not precisely performed, thus causing occurrence of product defects. The above occurrence of defects is usually detected in an inspection process as a post-process. The positional deviation in the transfer of the wafer W from the transfer device to the rise-and-fall pin often arises continuously instead of accidentally. As a result, when a defect is detected, a considerable number of defects already occur, thus causing huge damage.

The present invention is made to eliminate the above disadvantage, and an object of the present invention is to provide an art capable of quickly detecting a state in which a substrate transferred onto a processing plate is not accurately mounted at a substrate mounting position and holding defects in heat processing or cooling processing to a minimum.

Another object of the present invention is to provide an art capable of quickly detecting a position deviated from the substrate mounting position of the substrate transferred onto the processing plate and performing quick and accurate control.

To attain the above objects, a processing apparatus of the present invention is characterized by including a processing plate, on the front face of which a substrate is mounted, for heating or cooling the mounted substrate, a guide member for guiding the substrate, provided on the processing plate to surround a substrate mounting position on the processing plate, a temperature sensor disposed at a predetermined position on the processing plate, and means for judging that abnormality occurs when a temperature detected by the temperature sensor when the substrate is mounted on the processing plate does not change by not less than a predetermined range.

When the substrate transferred onto the processing plate is stranded on the guiding member and thereby deviated from the substrate mounting position, the substrate is lifted off the processing plate only because an edge of the substrate on the opposite side to a position at which the substrate is stranded on the guide member touches the front face of the processing plate. Meanwhile, in the processing plate for heating the substrate, for example, when the substrate is mounted on the processing plate, the processing plate is deprived of heat by the substrate, whereby the temperature of the processing plate once drops. When the substrate is lifted off the processing plate, a drop in temperature when the substrate is mounted on the processing plate decreases as compared with a case where the substrate is accurately mounted at the substrate mounting position. In the present invention, in view of this respect, when the temperature of the processing plate detected by the temperature sensor when the substrate is mounted on the processing plate does not change by not less than a predetermined range, it is judged that the substrate transferred onto the processing plate is not accurately mounted at the substrate mounting position, whereby a state in which the substrate transferred onto the processing plate is not accurately mounted at the substrate mounted position is quickly detected. Consequently, according to the present invention, defects in heat processing or cooling processing can be held to a minimum.

A processing apparatus of the present invention includes a processing plate, on the front face of which a substrate is mounted, for heating or cooling the mounted substrate, a guide member for guiding the substrate, provided on the processing plate to surround a substrate mounting position on the processing plate, a temperature sensor disposed at a position at a predetermined distance from the center of the substrate mounting position on the processing plate, and means for assuming a position deviated from the substrate mounting position of the substrate transferred onto the processing plate based on a temperature detected by the temperature sensor when the substrate is mounted on the processing plate.

When the substrate transferred onto the processing plate is stranded on the guiding member and thereby deviated from the substrate mounting position, the substrate is lifted off the processing plate only because the edge of the substrate on the opposite side to the position at which the substrate is stranded on the guide member touches the front face of the processing plate. Meanwhile, in the processing plate for heating the substrate, for example, when the substrate is mounted on the processing plate, the processing plate is deprived of heat by the substrate, whereby the temperature of the processing plate once drops. When the substrate is lifted off the processing plate, a drop in temperature when the substrate is mounted on the processing plate decreases as compared with the case where the substrate is accurately mounted at the substrate mounting position, and moreover such a drop in temperature differs depending on positions on the processing plate. For example, a position near the position at which the substrate is stranded on the guide member and a position on the opposite side to the above position (near the position at which the edge of the substrate on the opposite side to the position at which the substrate is stranded on the guide member touches the processing plate) are different in temperature drop when the substrate is mounted on the processing plate. Specifically, the space between the substrate and the processing plate in the vicinity of the position at which the substrate is stranded on the guide member is larger than the space between the substrate and the processing plate on the opposed side to the above position, whereby a drop in temperature when the substrate is mounted on the processing plate in the vicinity of the position at which the substrate is stranded on the guide member is smaller. In the present invention, in view of this respect, a position deviated from the substrate mounting position of the substrate transferred onto the processing plate can be quickly detected, and quick and accurate control can be performed by assuming the position deviated from the substrate mounting position of the substrate transferred onto the processing plate based on the temperature detected by the temperature sensor at a predetermined position on the processing plate when the substrate is mounted on the processing plate.

A processing apparatus of the present invention includes a processing plate, on the front face of which the substrate is mounted, for heating or cooling the mounted substrate, a guide member for guiding the substrate, provided on the processing plate to surround a substrate mounting position on the processing plate, a plurality of temperature sensors respectively provided at separate positions on the processing plate, and means for assuming a position deviated from the substrate mounting position of the substrate transferred onto the processing plate based on difference in temperatures detected by the respective temperature sensors when the substrate is mounted on the processing plate.

In the present invention, a position deviated from the substrate mounting position of the substrate transferred onto the processing plate can be quickly detected, and quick and accurate control can be performed by assuming the position deviated from the substrate mounting position of the substrate transferred onto the processing plate based on difference in temperatures detected by the respective temperature sensors provided at separate positions on the processing plate when the substrate is mounted on the processing plate.

A processing system of the present invention includes a plurality of processing apparatus each including a processing plate, on the front face of which the substrate is mounted, for heating or cooling the mounted substrate, a guide member for guiding the substrate provided on the processing plate to surround a substrate mounting position on the processing plate, a temperature sensor disposed at a predetermined position on the processing plate, and means for judging that the substrate transferred onto the processing plate is not accurately mounted at the substrate mounting position when a temperature detected by the temperature sensor when the substrate is mounted on the processing plate does not change by not less than a predetermined range, a transfer device for transferring the substrate at least between the processing apparatus, and means for banning processing by one of the processing apparatus and allowing the remaining processing apparatus to perform the processing when it is judged that the substrate transferred onto the processing plate is not accurately mounted at the substrate mounting position in the one processing apparatus.

In the present invention, when it is judged that the substrate transferred onto the processing plate is not accurately mounted at the substrate mounting position in one processing apparatus, processing by the one processing apparatus is banned and the remaining processing apparatus are allowed to perform the processing, thereby making it possible to prevent the continuous occurrence of defects due to heat processing or cooling processing, and to continue ordinary processing without stopping the system even if such defects occur.

A processing system of the present invention includes a plurality of processing apparatus each including a processing plate, on the front face of which the substrate is mounted, for heating or cooling the mounted substrate, a guide member for guiding the substrate provided on the processing plate to surround a substrate mounting position on the processing plate, a temperature sensor disposed at a predetermined position on the processing plate, and means for judging that the substrate transferred onto the processing plate is not accurately mounted at the substrate mounting position when a temperature detected by the temperature sensor when the substrate is mounted on the processing plate does not change by not less than a predetermined range, a transfer device for transferring the substrate at least between the processing apparatus, and means for banning processing by one of the processing apparatus and allowing the remaining processing apparatus to perform the processing when it is continuously judged that the substrate transferred onto the processing plate is not accurately mounted at the substrate mounting position in the one processing apparatus.

In the present invention, when it is continuously judged that the substrate transferred onto the processing plate is not accurately mounted at the substrate mounting position in one processing apparatus, processing by the one processing apparatus is banned and the remaining processing apparatus are allowed to perform the processing, thereby making it possible to prevent the continuous occurrence of defects due to heat processing or cooling processing, and to continue ordinary processing without stopping the system even if such defects occur. Moreover, when the substrate transferred onto the processing plate is not accurately mounted at the substrate mounting position by accident, a ban on processing by the one processing is eliminated.

A processing system of the present invention includes a plurality of processing apparatus each including a processing plate, on the front face of which the substrate is mounted, for heating or cooling the mounted substrate, a guide member for guiding the substrate provided on the processing plate to surround a substrate mounting position on the processing plate, a temperature sensor disposed at a predetermined position on the processing plate, and means for judging that the substrate transferred onto the processing plate is not accurately mounted at the substrate mounting position when a temperature detected by the temperature sensor when the substrate is mounted on the processing plate does not change by not less than a predetermined range, a transfer device for transferring the substrate at least between said processing apparatus, and means for marking the substrate processed by one of the processing apparatus when it is judged that the substrate transferred onto the processing plate is not accurately mounted at the substrate mounting position in the one processing apparatus.

In the present invention, when it is judged that the substrate transferred onto the processing plate is not accurately mounted at the substrate mounting position in one processing apparatus, the substrate processed by the one processing apparatus is marked, which makes it possible to continue ordinary processing without stopping the system even if defects due to heat processing or cooling processing occur and moreover to easily distinguish defective substrates from normal substrates. It should be mentioned that "marking" if includes marking for the defective substrates so as to distinguish them from the normal substrates on software side in addition to actual and direct marking for the substrate.

The present invention is a distinguishing method of distinguishing whether or not a substrate transferred onto a processing plate is accurately mounted at a substrate mounting position in a processing apparatus including the processing plate, on the front face of which the substrate is mounted, for heating or cooling the mounted substrate, a guide member for guiding the substrate provided on the processing plate to surround the substrate mounting position on the processing plate, including the steps of detecting a temperature at a predetermined position on the processing plate, and judging that the substrate transferred onto the processing plate is not accurately mounted at the substrate mounting position when the detected temperature does not change by not less than a predetermined range.

The present invention is a method of detecting a position deviated from a substrate mounting position of a substrate transferred onto a processing plate in a processing apparatus including the processing plate, on the front face of which the substrate is mounted, for heating or cooling the mounted substrate, a guide member for guiding the substrate provided on the processing plate to surround the substrate mounting position on the processing plate, including the steps of detecting a temperature at a predetermined position on the processing plate, and assuming the position deviated from the substrate mounting position of the substrate transferred onto the processing plate based on the detected temperature.

The present invention is a method of detecting a position deviated from a substrate mounting position of a substrate transferred onto a processing plate in a processing apparatus including the processing plate, on the front face of which the substrate is mounted, for heating or cooling the mounted substrate, a guide member for guiding the substrate provided on the processing plate to surround the substrate mounting position on the processing plate, including the steps of detecting temperatures at a plurality of positions on the processing plate, and assuming the position deviated from the substrate mounting position of the substrate transferred onto the processing plate based on difference in the temperatures detected at the plurality of positions.

These objects and still other objects and advantages of the present invention will become apparent upon reading the following specification when taken in conjunction with the accompanying drawings.

BRIEF DESCRIPTION OF THE DRAWINGS

FIG. 3 is a rear view of the resist coating and developing system shown in FIG. 1;

FIG. 8 is an explanatory view of operation (the second operation) of the heat processing unit according to the embodiment of the present invention;

FIG. 9 is an explanatory view of operation (the third operation) of the heat processing unit according to the embodiment of the present invention;

FIG. 10 is an explanatory view of operation (the fourth operation) of the heat processing unit according to the embodiment of the present invention;

FIG. 11 is a diagram showing temperature changes in the heat processing unit in the embodiment of the present invention;

FIG. 12 is an explanatory view of a heat processing unit according to another embodiment of the present invention;

FIG. 13 is an explanatory view of a heat processing unit according to still another embodiment of the present invention;

FIG. 14 is a diagram showing temperature changes in the heat processing unit according to the above still another embodiment of the present invention;

FIG. 20 is a diagram showing temperature changes in a heat processing unit in another embodiment of the present invention;

FIG. 21 is an explanatory view of a heat processing unit according to still another embodiment of the present invention;

DETAILED DESCRIPTION OF THE PREFERRED EMBODIMENT

A preferred embodiment in which the present invention is applied to a resist coating and developing system for coating a semiconductor wafer with a chemically amplified resist and developing it will be explained based on the drawings.

Figure 1:
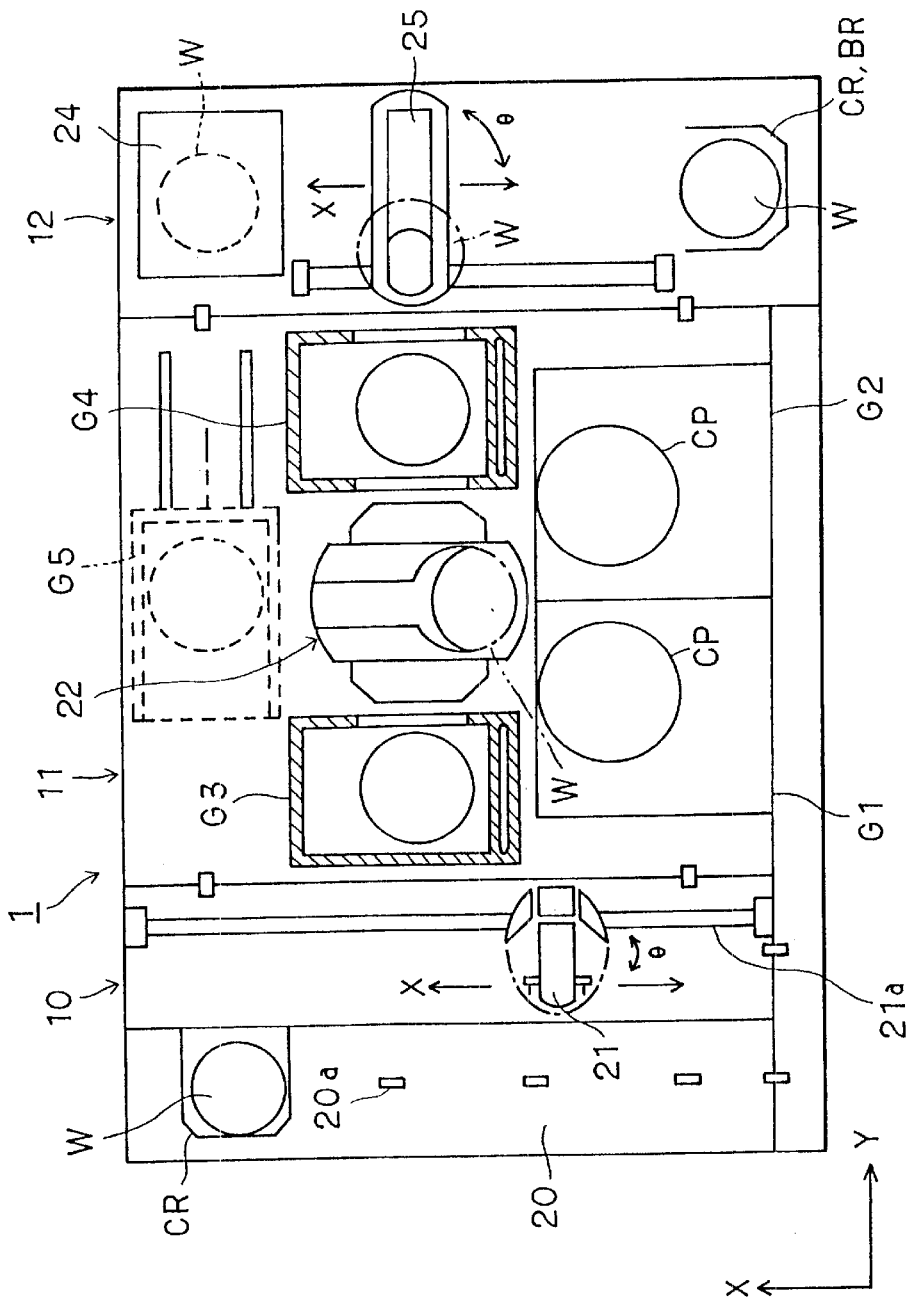
FIG. 1 is a plan view of a resist coating and developing system according to one embodiment of the present invention.
Figure 2:
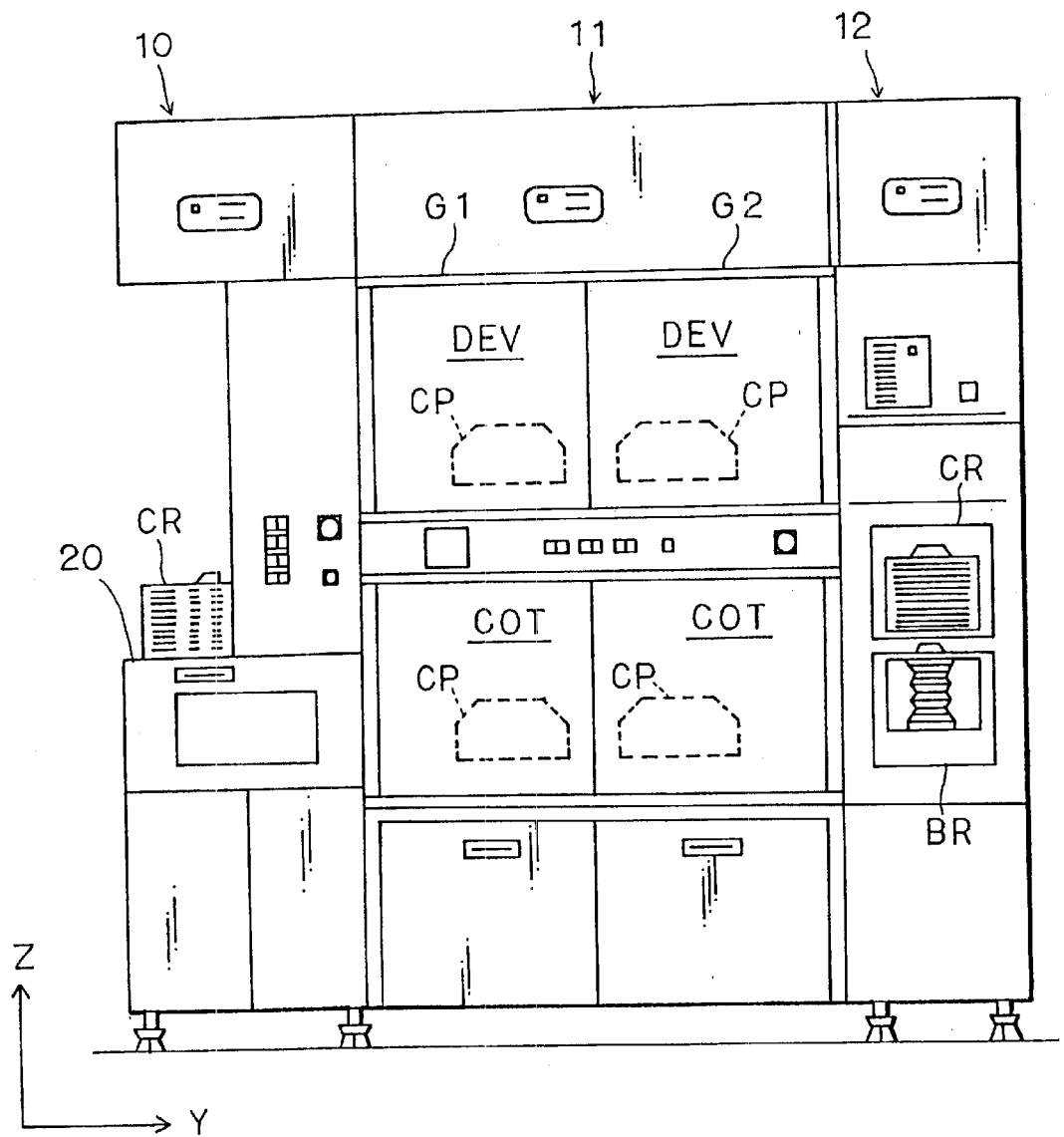
FIG. 2 is a front view of the resist coating and developing system shown in FIG. 1.
Figure 4:
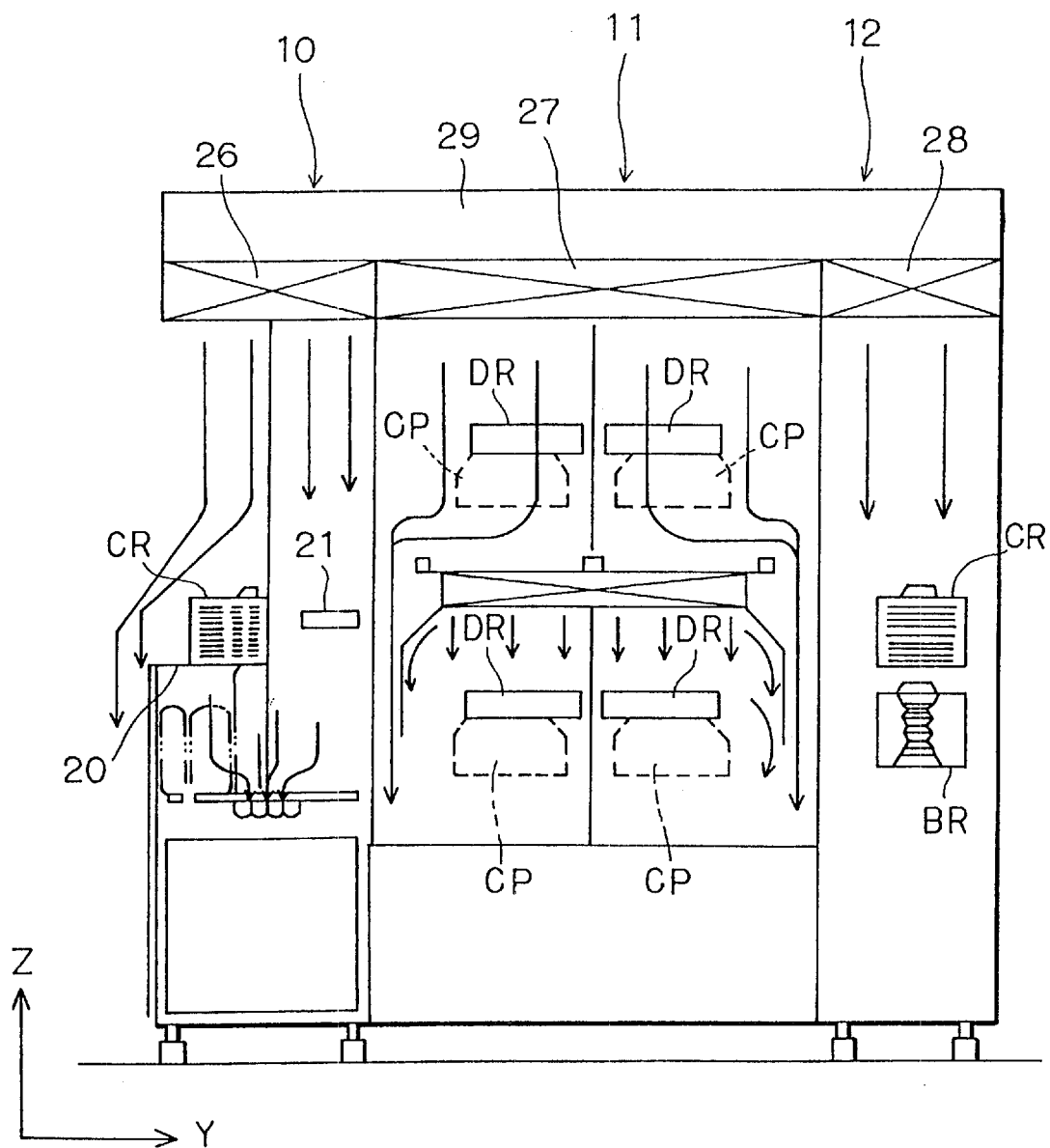
FIG. 4 is a front view showing the flow of air in the resist coating and developing system shown in FIG. 1.

FIG. 1 is a plan view of the resist coating and developing system according to this embodiment, FIG. 2 is a front view of the resist coating and developing system shown in FIG. 1, FIG. 3 is a rear view of the resist coating and developing system shown in FIG. 1, and FIG. 4 is a front view showing the flow of air in the resist coating and developing system shown in FIG. 1.

As shown in FIG. 1, the resist coating and developing system 1 has a configuration in which a cassette station 10, a processing station 11, and an interface section 12 are integrally connected. In the cassette station 10, a plurality of wafers W, for example, 25 wafers W per cassette C, as a unit, are transferred from/to the outside into/from the resist coating and developing system 1. The wafer W is carried into/out of the cassette C. In the processing station 11, various kinds of single wafer processing units each for performing predetermined processing for the wafers W one by one in coating and developing processes are multi-tiered at predetermined positions. In the interface section 12, the wafer W is sent and received to/from an aligner 13 provided adjacent to the resist coating and developing system 1.

In the cassette station 10, a plurality of cassettes C, for example, four cassettes C are mounted with respective transfer ports for the wafer W facing the side of the processing station 11 at the positions of positioning projections 20a on a cassette mounting table 20 in a line in an X-direction (a vertical direction in FIG. 1). A wafer transfer device 21 movable in the direction of arrangement of the cassettes C (the X-direction) and in the direction of arrangement of the wafers W housed in the cassette C (a Z-direction; a vertical direction) is movable along a transfer path 21a and selectively gets access to each of the cassettes C.

The wafer transfer device 21 is structured to be rotatable in a θ-direction so that it is accessible to an alignment unit (ALIM) and an extension unit (EXT) which are included in a multi-tiered unit section in a third processing unit group G3 on the processing station 11 side as described later.

In the processing station 11, as shown in FIG. 1, a vertical transfer-type transfer device 22 is provided in the center thereof. Around the transfer device 22, various kinds of processing units as processing chambers are multi-tiered in one group or plural groups, composing processing unit groups. In the above resist coating and developing system 1, five processing unit groups G1, G2, G3, G4, and G5 can be arranged. It is possible to arrange the first and second processing unit groups G1 and G2 on the front side of the system, the third processing unit group G3 adjacent to the cassette station 10, the fourth processing unit group G4 adjacent to the interface section 12, and the fifth processing unit group G5 shown by a broken line on the rear side. The transfer device 22 is structured to be rotatable in the θ-direction and movable in the Z-direction so that it can receive and send the wafer W from/to the respective processing units.

In the first processing unit group G1, two spinner-type processing units in which the wafer W is placed on a spin chuck in a cup CP to undergo predetermined processing, for example, a resist coating unit (COT) and a developing unit (DEV) are two-tiered from the bottom in order as shown in FIG. 2. In the second processing unit group G2 similarly to the first processing unit group G1, two spinner-type processing units, for example, a resist coating unit (COT) and a developing unit (DEV) are two-tiered from the bottom in order.

As shown in FIG. 3, in the third processing unit group G3, oven-type processing units in each of which the wafer W is placed on a mounting table (not illustrated) to undergo predetermined processing, for example, a cooling unit (COL) for cooling processing, an adhesion processing unit (AD) for so-called hydrophobic processing to enhance fixedness of a resist, an alignment unit (ALIM) for alignment, an extension unit (EXT), heat processing units (PREBAKE) for pre-bake, and heat processing units (POBAKE) for post-bake are, for instance, eight-tiered from the bottom in order.

Similarly, in the fourth processing unit group G4, oven-type processing units in each of which the wafer W is mounted on a mounting table to undergo predetermined processing, for example, a cooling unit (COL) for cooling processing, an extension and cooling unit (EXTCOL) serving also for cooling processing, an extension unit (EXT), an adhesion processing unit (AD), heat processing units (PREBAKE) for pre-bake, and heat processing units (POBAKE) for post-bake are, for instance, eight-tiered from the bottom in order.

As shown in FIG. 1, the interface section 12 is the same as the processing station 11 in a depth directional (X-directional) size but smaller than the processing station 11 in a width directional size. As shown in FIG. 1 and FIG. 2, a transportable pickup cassette CR and a fixed buffer cassette BR are two-tiered at the front of the interface section 12, and a peripheral aligner 24 is disposed at the rear thereof.

A wafer transfer device 25 is provided at the center of the interface section 12. The wafer transfer device 25 moves in the X-direction and the Z-direction (the vertical direction) to be accessible to both the cassettes CR and BR, and the peripheral aligner 24. The wafer transfer device 25 is also rotatable in the θ-direction to be accessible to the extension unit (EXT) included in the fourth processing unit group G4 on the processing station 11 side and to a wafer delivery table (not illustrated) on the adjacent aligner side.

As shown in FIG. 4, a filter 26 is attached on the top of the cassette station 10, a filter 27 on the top of the processing station 11, and a filter 28 on the top of the interface section 12, respectively. These filters have an upper space 29 in common. The upper space 29 communicates with an air conditioner (not illustrated) on the lower side via a duct (not illustrated) to eliminate ammonia, and clean air of which the humidity and temperature are controlled is supplied to the upper space 29 from the air conditioner. The clean air is blown out downward from the upper space 29 through each filter, thereby forming the downflow of clean air in each of sections 10, 11, and 12.

Figure 5:
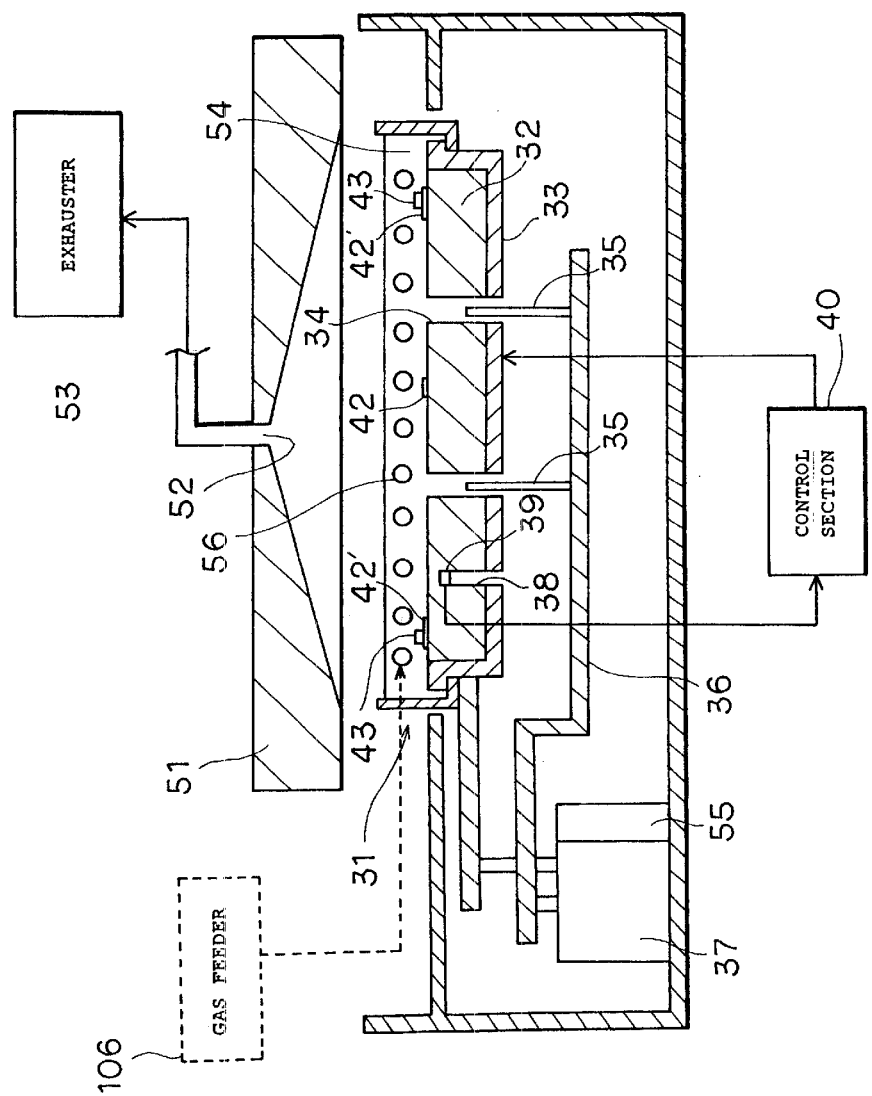
FIG. 5 is a front view showing a heat processing unit shown in FIG. 3.
Figure 6:
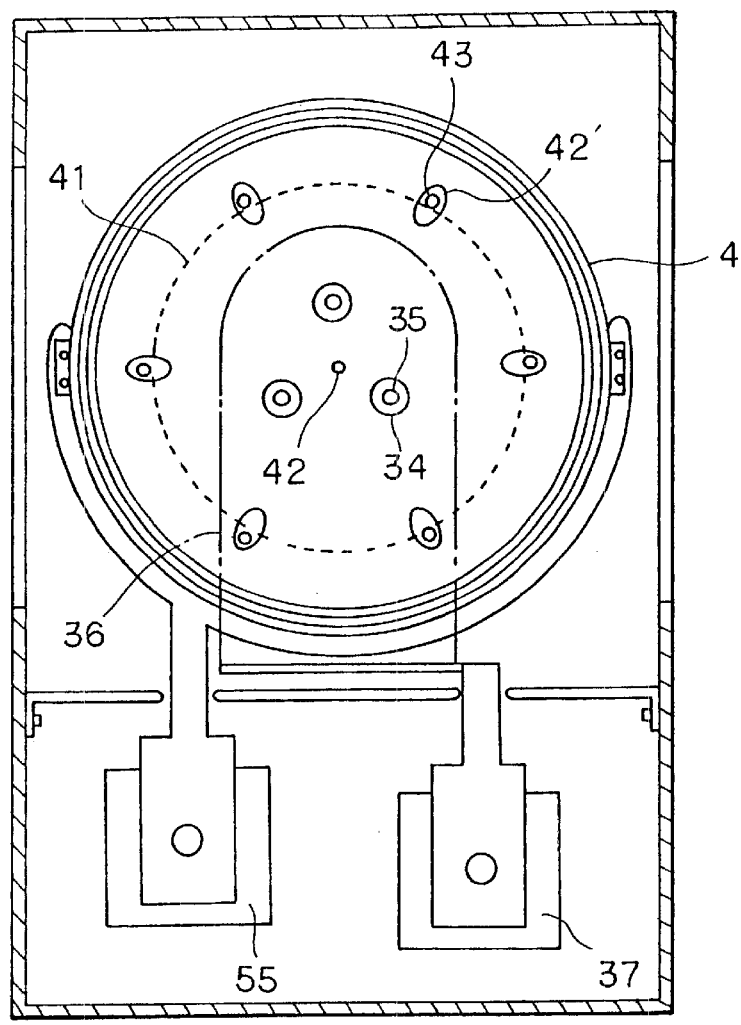
FIG. 6 is a plan view of the heat processing unit shown in FIG. 5.

FIG. 5 is a front view of the aforesaid heat processing unit, and FIG. 6 is a plan view thereof.

As shown in FIG. 5 and FIG. 6, a hot plate 31 as a processing plate for performing heat processing for the wafer W is disposed nearly in the center of the heat processing unit. In the hot plate 31, for example, on the rear face side of a circular holding plate 32 with a diameter slightly larger than the wafer W, a heating element 33 which has nearly the same shape as the holding plate 32, for example, a heater, a Peltier element, or the like, is disposed so as to be attached closely to the holding plate 32. The heating element 33 is composed of a registor which generates heat by the flow of an electric current. The value of the electric current is controlled by a control section 40 as a control mechanism, whereby the temperature for heat processing is controlled.

A through-hole 34 is provided at each of a plurality of positions, for example, at three positions between the front face and the rear face of the hot plate 31. A plurality of supporting pins, for example, three supporting pins 35 for receiving and sending the wafer W are inserted in the through-holes 34 respectively to freely protrude and retract. The supporting pins 35 are joined together on the rear face side of the holding plate 32 by means of a joining member 36 disposed on the rear face side of the holding plate 32. The joining member 36 is connected to a raising and lowering mechanism 37 disposed on the rear face side of the holding plate 32. The supporting pins 35 protrude from and retract into the front face of the holding plate 32 by the raising and lowering operation of the raising and lowering mechanism 37. The supporting pins 35 receives and sends the wafer W from/to the transfer device 22 while protruding from the front face of the holding plate 32. After receiving the wafer W from the transfer device 22, the supporting pins 35 descend and retract into the holding plate 32, whereby the wafer W is mounted closely on the front face of the holding plate 32 and then heat processing for the wafer W is performed.

A lid body 51 is placed above the holding plate 32 to cover the wafer W held by the holding plate 32. The lid body 51 can be raised and lowered by a raising and lowering mechanism not illustrated. In this unit, the lid body 51 is raised and taken off, and in that state the wafer W is received and sent from/to the transfer device 22, and the lid body 51 is lowered and shut down, and in that state a closed space is formed and heat processing for the wafer W is performed.

The lid body 51 has a structure tilting upward to nearly the center thereof. An exhaust port 52 is provided in a position corresponding to nearly the center thereof, that is, nearly the center of the wafer W held by the holding plate 32. An exhauster 53 such as a vacuum pump is connected to the exhaust port 52, whereby exhaust inside the closed space is performed.

Around the hot plate 31, a shutter member 54 is disposed to freely protrude and retract in such a manner to surround the hot plate 31. The shutter member 54 is raised and lowered by a raising and lowering mechanism 55 placed on the rear face of the hot plate 31. Numerous spouting holes 56 for spouting high-temperature inactive gas, for example, are provided in the inner wall of the shutter member 54. The spouting holes 56 are connected to a high-temperature gas feeder 106 for supplying high-temperature gas to the spouting holes 56. When the wafer W is heated while being held on the holding plate 32, the shutter member 54 protrudes from the front face of the hot plate 31, and high-temperature gas is spouted from the spouting holes 56 toward the front face of the wafer W held on the holding plate 32.

In order that heat processing for the wafer W is satisfactorily performed in the heat processing unit, the wafer W needs to be mounted nearly in the center on the hot plate 31 with little uneven temperature distribution. A position at which the wafer W is originally to be mounted on the hot plate 31 as described above is called a substrate mounting position, and an area 41 enclosed by a dotted line in FIG. 6 is the substrate mounting position.

Proximity sheets 42' for holding the wafer W at predetermined intervals above and apart from the hot plate 31 while lifting the wafer W off the hot plate 31 without mounting it closely on the hot plate 31 so that the hot plate and the wafer W do not touch with each other are disposed at a plurality of positions, for example, at six positions at the outer peripheral portion of the substrate mounting position 41, and moreover a proximity pin 42 is disposed in the center of the substrate mounting position 41.

The proximity sheets 42' disposed at the outer peripheral portion of the substrate mounting position 41 respectively extend to the outside of the substrate mounting position 41. At positions to which respective proximity sheets 42' extend, guides 43 for guiding a substrate are arranged. Hence, in this embodiment, six guides 43 are provided on the hot plate 31 so as to enclose the substrate mounting position 41. The guide 43 has, for example, a rectangular section and a height (at least height of a nearly vertical portion of a wall surface on the substrate mounting position 41 side) of more than one millimeter, more preferably, around three millimeters.

In a position at a predetermined distance from the center of the substrate mounting position 41, for example, in a position close to the outer periphery of the substrate mounting position 41, a hole 38 with its bottom blocked at a predetermined depth is provided from the rear face toward the front face of the hot plate 31. Disposed at the bottom of the hole 38 (at a position closest to the front face of the holding plate 32 in the hole 38) is a temperature sensor 39 which is a thermocouple, for instance. Detection results by the temperature sensor 39 are sent to the control section 40. In the control section 40, the control of an electric current for the heating element 33 as a heating mechanism, the detection of defective mounting of the wafer W which will be described later, and the like are performed based on the detection results. A speaker or a display section (not illustrated) for giving an alarm is connected to the control section 40. In this case, in the display section, it is indicated to an operator whether the processing will be continued or not, and in accordance with the above indication, the operator may give an instruction to continue the operation by means of a keyboard not illustrated or the display section serving also as an input section, or may suspend the processing. If the heat processing is suspended, positional deviation between the transfer device 22 and the supporting pins 35 which will be described later can be immediately amended. Moreover, If the processing is continued, the processing can be performed without the throughput of the system being lowered. In this case, however, the defectively heated wafer W comes to flow mixed with non-defectives in the system. Therefore, when the processing is continued, a mark for showing a defective wafer is necessary for the wafer W. As such a marking method, in addition to actual and direct marking for the wafer W, it is possible to perform marking for the defective wafers W on software side so that the defective wafers W can be distinguished from non-defectives.

Next, the operation of the heat processing unit thus structured will be explained with reference to FIG. 7 to FIG. 10.

Figure 7:
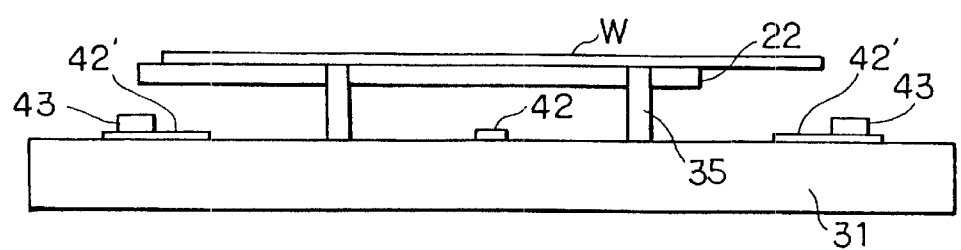
FIG. 7 is an explanatory view of operation (the first operation) of the heat processing unit according to the embodiment of the present invention.

First, as shown in FIG. 7, the wafer W is delivered onto the supporting pins 35 from the transfer device 22 while the supporting pins 35 protrude from the front face of the hot plate 31.

Next, as shown in FIG. 8, after receiving the wafer W from the transfer device 22, the supporting pins 35 descend and retract into the hot plate 31, whereby the wafer W is placed on the hot plate 31. Then, heat processing is performed for the wafer W.

After the heat processing for the wafer W is completed, the supporting pins 35 protrude again, and the transfer device 22 receives the wafer W placed on the supporting pins 35.

FIG. 7 and FIG. 8 show an example in which the wafer W is transferred without positional deviation between the transfer device 22 and the supporting pins 35 and thus accurately mounted within the substrate mounting position 41 on the hot plate 31.

However, if the wafer W is transferred at a position deviated from a desired position (shown by a dotted line) on the supporting pins 35 when being transferred from the transfer device 22 to the supporting pins 35 as shown in FIG. 9, the wafer W is stranded on the guide 43 without being accurately mounted within the substrate mounting position 41 as shown in FIG. 10 when the supporting pins 35 thereafter descend and retract into the hot plate 31.

FIG. 11 shows temperature changes of the hot plate 31 detected by the temperature sensor 39 in heat processing. FIG. 11① shows a temperature change when the wafer W is accurately placed within the substrate mounting position 41 on the hot plate 31 as shown in FIG. 8, and FIG. 11② shows a temperature change when the wafer W is stranded on the guide 43 without being accurately placed within the substrate mounting position 41 as shown in FIG. 10. As is evident from FIG. 11, a case in which the wafer W is accurately mounted within the substrate mounting position 41 on the hot plate 31 and a case in which the wafer W is stranded on the guide 43 without being accurately mounted within the substrate mounting position 41 are different in temperature change. Specifically, in the former case, the temperature once drops more sharply than in the latter case. This is because the proximity area between the wafer W and the substrate mounting position 41 is larger when the wafer W is accurately mounted within the substrate mounting position 41, thus depriving the hot plate 31 of larger heat quantity.

In this embodiment, the control section 40 detects defective mounting of the wafer W shown in FIG. 10 based on such a difference in temperature change. Namely, the control section 40 inputs the temperature detection results of the hot plate 31 from the temperature sensor 39. The control section 40 judges that the wafer W is accurately mounted within the substrate mounting position 41 on the hot plate 31 as shown in FIG. 8 if the temperature of the hot plate 31 is not more than a predetermined threshold, for example, not more than 89° C. in the example shown in FIG. 11 when the wafer W is mounted on the hot plate 31, and judges that the wafer W is stranded on the guide 43 without being accurately mounted within the substrate mounting position 41 as shown in FIG. 10 if the temperature of the hot plate 31 is not less than the predetermined threshold, for example, not less than 89° C. in the example shown in FIG. 11 when the wafer W is mounted on the hot plate 31. When it is judged that the wafer W is stranded on the guide 43, an alarm is given by means of the speaker or the display section. Incidentally, the predetermined threshold may be an absolute temperature as described above or may be the range of temperature drop from a reference temperature when the temperature of the hot plate 31 before the wafer W is mounted thereon is the reference temperature.

As described above, in the heat processing unit of this embodiment, when the temperature of the hot plate 31 is not less than the predetermined threshold when the wafer W is plated on the hot plate 31, it is judged that the wafer W is stranded on the guide 43 and the alarm is given by the speaker or the display section. Therefore, the state in which the wafer W transferred onto the hot plate 31 is not accurately mounted at the substrate mounting position 41 is promptly detected, thus holding defects in heat processing to a minimum. Moreover, the temperature sensor 39 is conventionally a necessary device to control the temperature of the hot plate 31, thereby obtaining the above effects without need of special hard configuration.

Further, the guide 43 for guiding the wafer W into the substrate mounting position 41 has a rectangular section and a height of around three millimeters in this embodiment, whereby the range of temperature drop of the hot plate 31 when the wafer W is stranded on the guide 43 without being accurately mounted within the substrate mounting position 41 becomes smaller. Namely, the difference in temperature drop between the state in which the wafer W is accurately mounted within the substrate mounting position 41 on the hot plate 31 and the state in which the wafer W is stranded on the guide 43 without being accurately mounted within the substrate mounting position 41 becomes larger. Accordingly, the difference between the above states can be more clearly distinguished, thus eliminating false detection and facilitating the control of the above threshold. In the present invention, however, it is naturally possible that the guide 43 is structured to have a slant face 43a for guiding the wafer toward the substrate mounting position 41 and a height of one millimeter or less. Since the guide 43 has the slant face 43a for guiding the wafer, the wafer W can be guided into the substrate mounting position 41 more certainly.

Next, another embodiment of the present invention will be explained.

When positions at which the wafer W is stranded on the guide 43 (like the wafer W shown by a full line and the wafer W shown by a dotted line in FIG. 13, for example) are different as shown in FIG. 13, temperature changes differ according to positions at which the wafer W is stranded thereon. For example, the temperature change in a case (FIG. 14①) shown by the full line in FIG. 13 is larger as compared with a case (FIG. 14②) shown by the dotted line in FIG. 13. Namely, in the former case, the temperature once drops more sharply than in the latter case.

Hence, in this embodiment, the control section 40 assumes a position deviated from the substrate mounting position 41 of the wafer W transferred onto the hot plate 31 based on the above difference in temperature change, and the assumed result is displayed in a display section 45, for example. Therefore, the operator, for example, can easily amend the positional deviation between the transfer device 22 and the supporting pins 35 based on the display content. Further, the positional deviation between the transfer device 22 and the supporting pins 35 may be automatically amended in accordance with the assumed deviated position.

Figure 15:
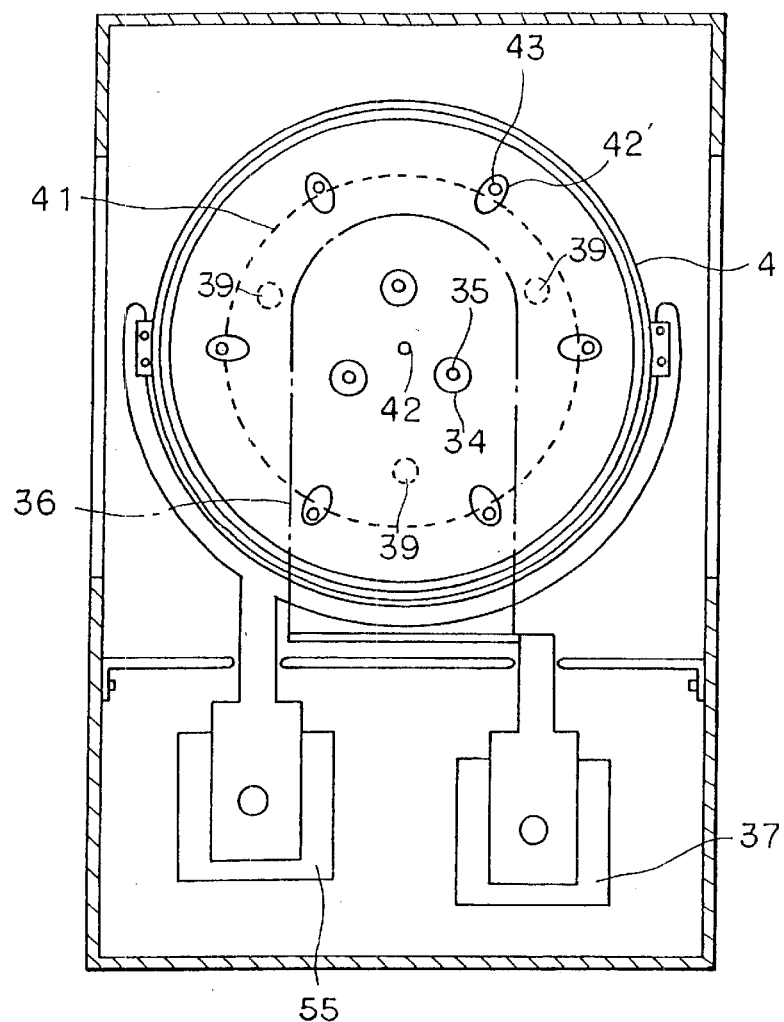
FIG. 15 is a plan view of a heat processing unit according to yet another embodiment of the present invention.

It should be mentioned that the deviated position of the wafer W on the hot plate 31 can be more exactly assumed by arranging the temperature sensors 39 at a plurality of positions, more preferably, more than three positions, for example, three positions as shown in FIG. 15, and using detection results at the plurality of positions.

Next, still another embodiment of the present invention will be explained.

Figure 16:
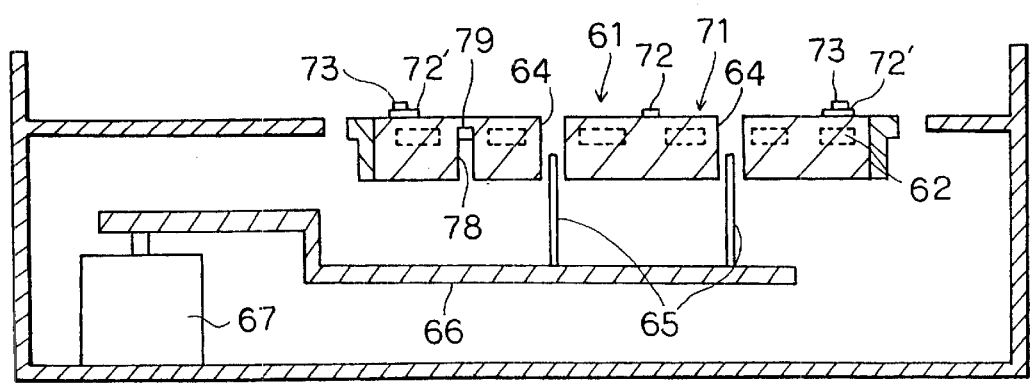
FIG. 16 is a front view of a cooling unit according to another embodiment of the present invention.

In this embodiment, the present invention is applied to the cooling unit in the coating and developing system shown in FIG. 1 to FIG. 4. FIG. 16 is a front view showing the structure of a chill plate in the cooling unit, which has almost the same structure as the aforesaid heat processing unit.

Specifically, as shown in FIG. 16, a chill plate 61 as a processing plate for performing cooling processing for the wafer W is disposed nearly in the center of the cooling unit. A lot of Peltier elements 62, for example, are embedded in the chill plate 61. The value of the electric current flowing into the Peltier elements 62 is controlled by a control section (not illustrated), thus controlling the temperature for cooling processing.

A through-hole 64 is provided at each of a plurality of positions, for example, at three positions between the front face and the rear face of the chill plate 61. A plurality of supporting pins, for example, three supporting pins 65 for receiving and sending the wafer W are inserted in the through-holes 64 respectively to freely protrude and retract. The supporting pins 65 are joined together on the rear face side of the chill plate 61 by means of a joining member 66 disposed on the rear face side of the chill plate 61. The joining member 66 is connected to a raising and lowering mechanism 67 disposed on the rear face side of the chill plate 61. The supporting pins 65 protrude from and retract into the front face of the chill plate 61 by the raising and lowering operation of the raising and lowering mechanism 67. A lid body not illustrated which can ascend and descend is placed above the chill plate 61.

Proximity sheets 72' are disposed at a plurality of positions, for example, at six positions at the outer peripheral portion of a substrate mounting position 71, and moreover a proximity pin 72 is disposed in the center of the substrate mounting position 71. The proximity sheets 72' disposed at the outer peripheral portion of the substrate mounting position 71 respectively extend to the outside of the substrate mounting position 71. At positions to which respective proximity sheets 72' extend, guides 73 for guiding a substrate are arranged.

In a position at a predetermined distance from the center of the substrate mounting position 71, a hole 78 with its bottom blocked is provided from the rear face. Disposed at the bottom of the hole 78 is a temperature sensor 79. Detection results by the temperature sensor 79 are sent to the control section.

The control section detects defective mounting of the wafer W based on difference in temperature change of the chill plate 61. Namely, the control section inputs the temperature detection results of the chill plate 61 from the temperature sensor 79. The control section judges that the wafer W is accurately mounted within the substrate mounting position 71 on the chill plate 61 if the temperature of the chill plate 61 is not less than a predetermined threshold when the wafer W is mounted on the chill plate 61, and judges that the wafer W is stranded on the guide 73 without being accurately mounted within the substrate mounting position 71 if the temperature of the chill plate 61 is not more than the predetermined threshold when the wafer W is mounted on the chill plate 61. When it is judged that the wafer W is stranded on the guide 73, a try for accurately mounting the wafer W within the substrate mounting position 71 on the chill plate 61 by raising once the supporting pins 65 to lift the wafer W off the chill plate 61 and then lowering the supporting pins 65 again to return the wafer W onto the front face of the chill plate 61, is performed. When the wafer W is not accurately mounted within the substrate mounting position 71 on the chill plate 61 in spite of a retry, an alarm or the like is given.

Accordingly, in the cooling unit of this embodiment, poor cooling of the wafer W can be sharply decreased. Specially in the case of heat processing, a thermal budget until that time is important, and thus it is very difficult to turn once heated defectives into non-defectives even if the once heated defectives are heated again. In cooling processing, however, the thermal budget is not so significant, and hence it is effective to retry positioning and perform cooling processing again within the accurate substrate mounting position 71 as in this embodiment.

As for means for retrying positioning, vibratory equipment for giving vibration to the chill plate 61 may be provided, or the supporting pins 65 may be structured to vertically move at least not less than one time.

As is the case with the aforesaid heat processing unit, the cooling unit may be structured so that the assumption of deviated position is performed.

Next, yet another embodiment of the present invention will be explained.

Figure 17:
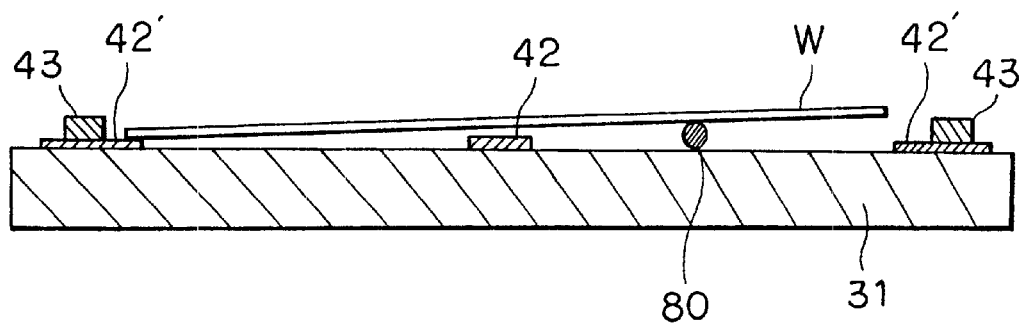
FIG. 17 is a sectional view of a heat processing unit according to still another embodiment of the present invention.

As shown in FIG. 17, when dust 80 such as particles adheres to the rear face of the transferred wafer W or when the dust 80 adheres onto the hot plate 31, similarly to the aforesaid case where positions at which the wafer W is stranded on the guide 43 are different, dispersion occurs in temperature detection by the temperature sensors 39 of the hot plate 31.

Figure 18:
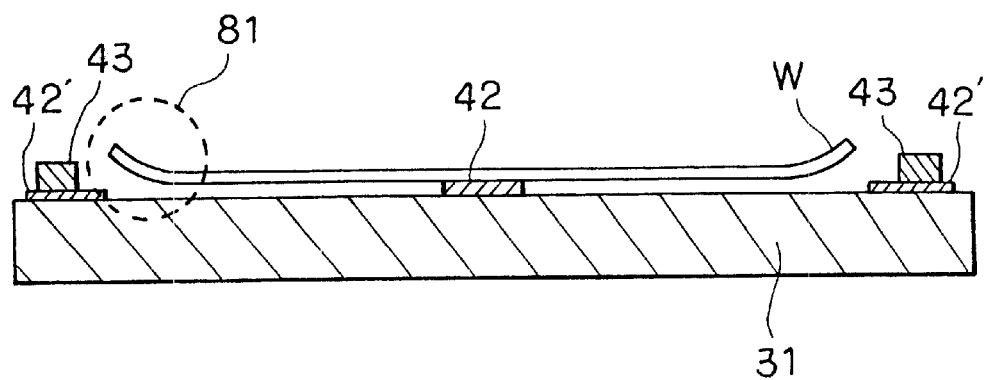
FIG. 18 is a sectional view of a heat processing unit according to yet another embodiment of the present invention.

Besides the above factors, as shown in FIG. 18, when the change of the shape of the wafer W itself, for example, irregularities such as a warp 81 and the like occur, dispersion arises in temperature detection by the temperature sensors 39 of the hot plate 31 in comparison with other normal flat wafers W.

Figure 19:
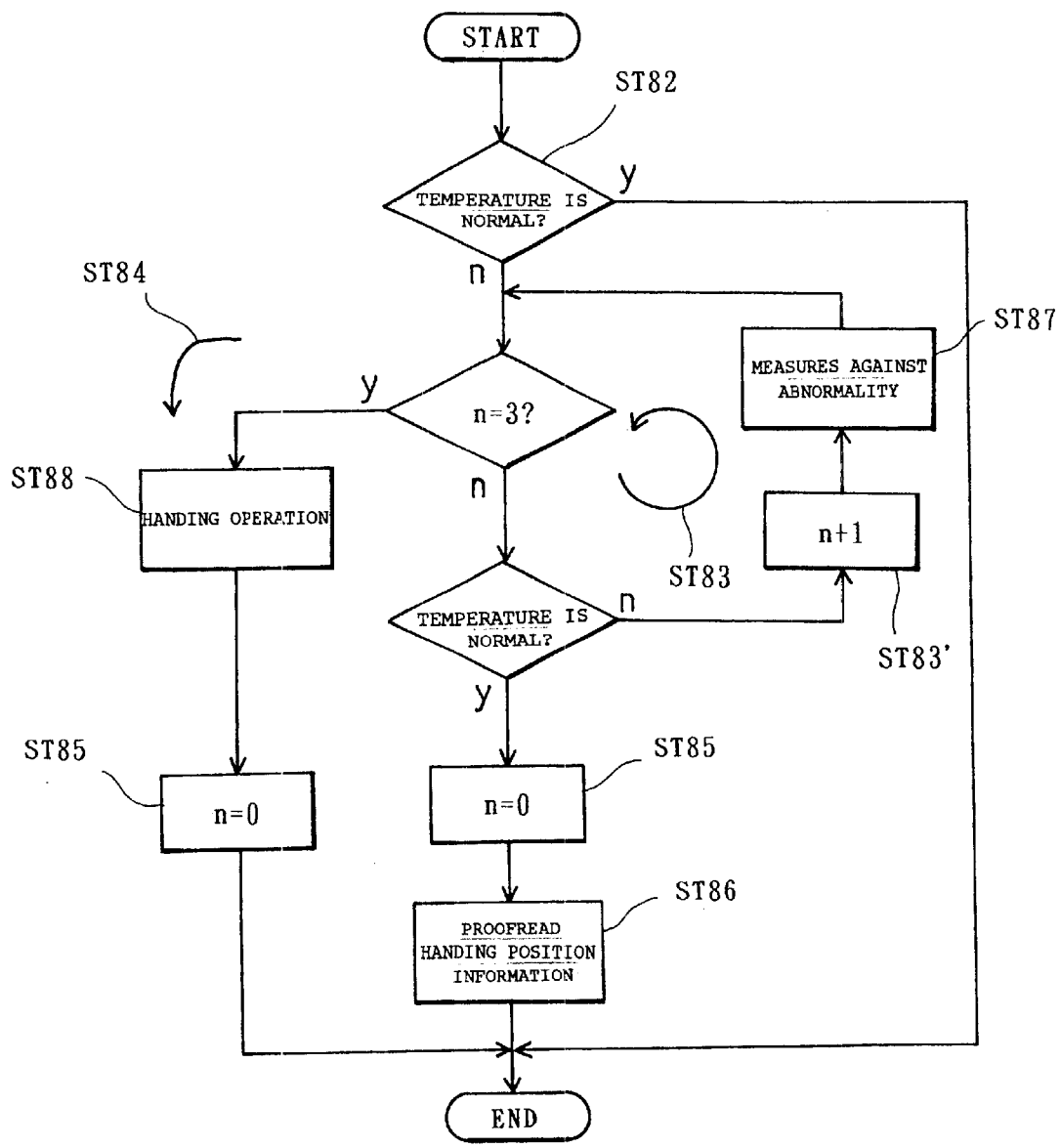
FIG. 19 is a processing flowchart explaining operation in one embodiment of the present invention.

Defective temperature processing of the wafer W caused by the above factors can be judged by sequence shown in FIG. 19, for example, since the positional deviation between the transfer device 22 or the supporting pins 35 and the wafer W can not be easily amended automatically. Namely, when the wafer W is transferred onto the hot plate 31, it is determined by a plurality of the temperature sensors 39 whether dispersion occurs in temperature detection or not (step 82). If the range of dispersion at this time is not more than a predetermined range, it can be judged to be normal, and the operation is completed.

Meanwhile, if the range of dispersion is not less than the predetermined range, it is judged to be abnormal, and therefore loop processing is repeated a predetermined number of times (step 83). In this repetition, the operation for amending the positional deviation of the wafer W with the transfer device 22 or the supporting pins 35 (step 87) is performed a predetermined number of times, for example, three times (counter value 3).

If the range of dispersion in temperature detection by the plurality of temperature sensors 39 when the wafer W is transferred onto the hot plate 31 becomes not more than the predetermined range, that is, the range of dispersion in temperature detection turns into a state in which it is judged to be normal within the predetermined number of times, the counter value is set at zero (step 85), and positional information for transferring the next wafer W is proofread from the positional deviation of transfer of the wafer W by the transfer device 22 and stored, and then the operation is completed.

When the range of dispersion is not less than the predetermined range even if the loop processing (step 83) is repeated the predetermined number of times, the dispersion of temperature is considered to be caused by such factors that the positional deviation of the wafer W can not be amended by the transfer device 22 or the supporting pins 35 (for example, by the aforesaid adhesion of particles, shape of the wafer W, or poor operation of the transfer device 22 or the supporting pins 35), the procedure advances to route 84, measures against abnormality (step 88) is then taken, the counter value is set at zero (step 85), and the operation is completed.

In the aforesaid measures against abnormality (step 88), an alarm may be given to the operator or the like as described above, and further it is desirable that information that the wafer W is defective is stored since processing for the wafer W is virtually incomplete, and that the information is transmitted to the outside by predetermined means such as display, communication. Thus, the defective wafer W can be discharged to the cassette C or the like without undergoing processing in processes subsequent to this processing, thereby avoiding waste in processing.

Next, still another embodiment of the present invention will be explained.

In temperature detection by the temperature sensor 39 when the wafer W is transferred onto the hot plate 31, when a threshold is set at 89° C. as shown in FIG. 20, for example, the case where the temperature detection value is within a first range 90 is judged to be normal, the case where the temperature detection value is within a second range 91 is judged to be caused by such factors that the positional deviation of the wafer W can not be amended by the transfer device 22 or the supporting pins 35 (caused by particles or the like as described above), and the case where the temperature detection value is within a third range 92 is judged to be caused by such factors that the positional deviation of the wafer W can be amended by the transfer device 22 or the supporting pins 35 (for example, the case where the wafer W is stranded on the guide 34 or the like).

The difference between the second range 91 and the third range 92 is also proportional to the distance between the hot plate 31 and the wafer W. The distance between the hot plate 31 and the wafer W when the wafer W is stranded on the guide 34 or the like is longer than the distance between the hot plate 31 and the wafer W due to particles or the like, whereby difference to a certain extent occurs in temperature according to difference in distance. Thus, the difference between the above two ranges is provided to distinguish the above two cases.

It becomes possible to take exact measures to deal with the abnormal situation without amending the positional deviation of the wafer W by means of the transfer device 22 or the supporting pins 35 every time by judging from the temperature detection value by the temperature sensor 39 in the above ranges whether the positional deviation of the wafer W can be amended by the transfer device 22 or the supporting pins 35, or the detected value is due to such factors that the positional deviation of the wafer W can not be amended. Consequently, it becomes possible to improve the throughput of processing or the availability factor of the unit.

Next, yet another embodiment of the present invention will be explained.

FIG. 21 shows an example in which a plurality of heating elements 33 of the hot plate 31, for example, a plurality of heaters, for instance, four heaters H1 to H4 are provided in a radial direction. These heating elements 33 are provided respectively with one or more temperature sensor 39 and structured to be able to detect the temperature in each area.

By providing the plurality of heating elements 33, the in-plane uniformity of temperature of the wafer W can be controlled further as compared with a system in which one heating element 33 is provided.

Figure 22:
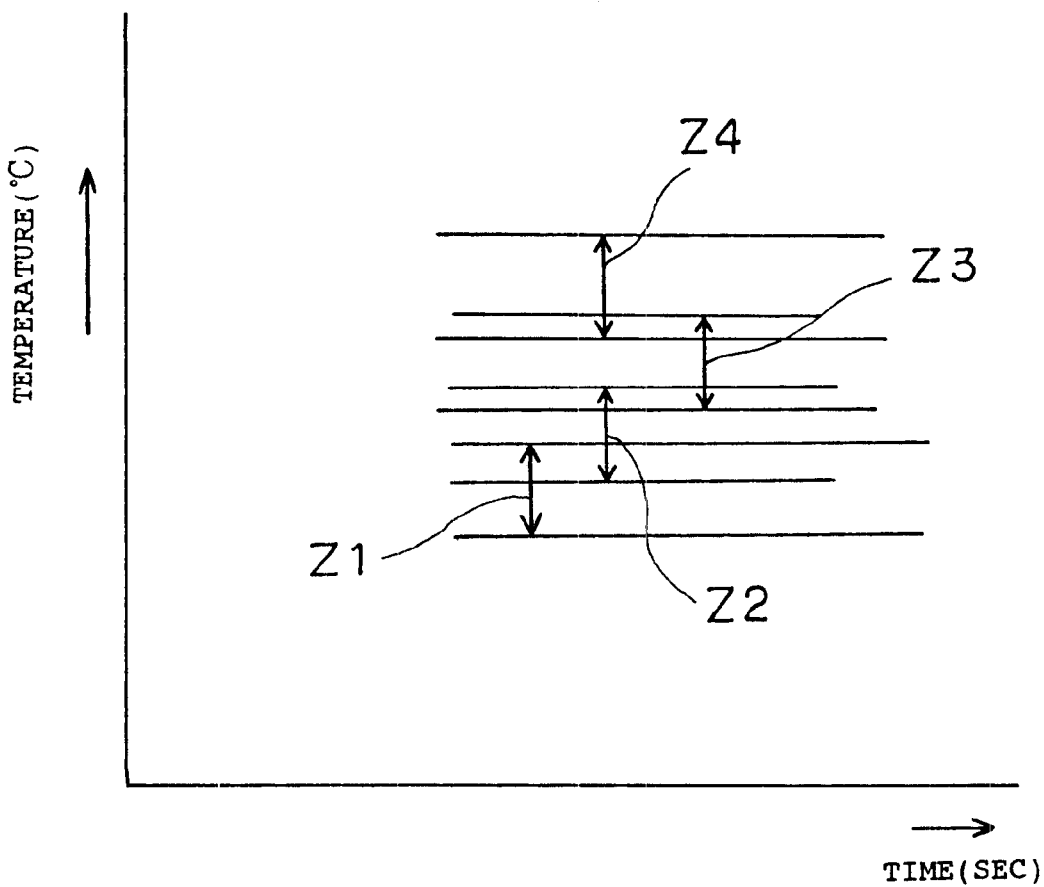
FIG. 22 is a diagram showing temperature ranges in a heat processing unit in yet another embodiment of the present invention.
Figure 23:
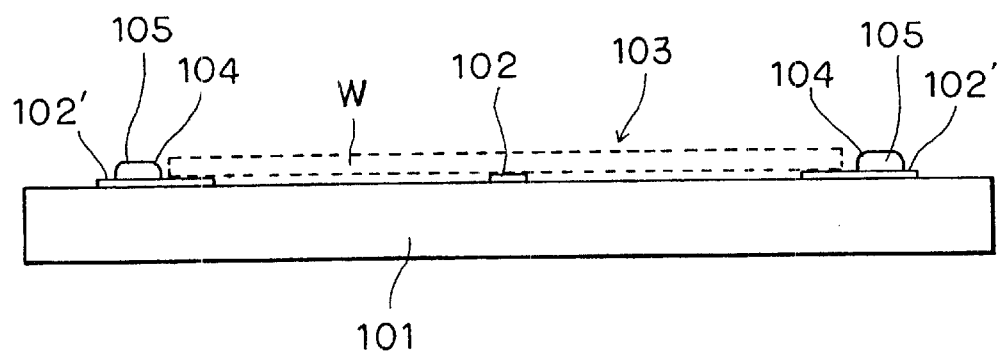
FIG. 23 is a schematic front view of a heat processing unit for explaining a prior art.

In the above structure, the control section may judge whether or not the temperature of the hot plate 31 is lowered to not more than the aforesaid threshold or whether or not the temperature thereof is lowered to a predetermined range when the wafer W is transferred onto the hot plate 31, based on the information from each of the temperature sensors 39. However, it is probable that respective heating elements 33H1 to 33H4 are different in gross heating value of the hot plate 31 for area of each heating element 33 and heating consumption per area of the wafer W which corresponds to each heating element 33 and temporarily deprives the hot plate 31 of heat. Therefore, with regard to a matter whether the point of fall of temperature is within a normal range or not, it is desirable to set different ranges Z1 to Z4 as shown in FIG. 22 and cope with the matter. It is also suitable to set the different ranges Z1 to Z4 and to set ranges for judging whether or not the detected value is due to such factor that the positional deviation of the wafer W can not be amended.

Further, when a plurality of heat processing units (or cooling units) are provided in the resist coating and developing system 1 as in the aforesaid embodiments, the structured is as follows.

For example, when it is judged that the wafer W transferred onto the hot plate is not accurately mounted at the substrate mounting position in a heat processing unit, heat processing by the heat processing unit is banned, and after that time the heat processing is performed in the remaining heat processing units. Thus, the continuous occurrence of defects due to heat processing is prevented, and moreover even if such defects arise, ordinary heat processing can be continued without the system being stopped.

Such a ban on heat processing in the heat processing unit may be placed only when the wafers W are not accurately mounted at the substrate mounting position continuously. Thus, the continuous occurrence of defects due to heat processing is prevented, and moreover even if such defects arise, ordinary heat processing can be continued without the system being stopped. Besides, when the wafer W transferred onto the hot plate is not accurately mounted at the substrate mounting position by accident, the ban on heat processing in the above heat processing unit is eliminated.

Further, although the speaker or the display section as means for giving an alarm or the like is connected to the control section 40 in the aforesaid embodiments, the present invention is not limited to the above example. For example, alarm information may be stored in a storage medium, for example, a hard disk, a memory such as RAM, or a floppy disk, and the alarm information may be transmitted to a CPU outside the unit by means of predetermined communication.

Furthermore, although the temperature sensors 39 for detecting temperatures at a plurality of positions are disposed in the aforesaid embodiments, it is needless to say that the detection at one position instead of plurality of positions is suitable, and therefore the present invention is not limited to the above example.

In the aforesaid embodiments, the example in which the wafer W is used for a substrate is explained. The present invention is not limited to the above example, but can be also applied to an example in which an LCD substrate is used.

The aforesaid embodiment has the intention of clarifying technical meaning of the present invention. Therefore, the present invention is not intended to be limited to the above concrete embodiment and to be interpreted in a narrow sense, and various changes may be made therein without departing from the spirit of the present invention and within the meaning of the claims.

What is claimed is:

1. A processing apparatus for performing a heat processing or a cooling processing for a substrate, comprising:
    a processing plate adapted to heat or cool the substrate mounted thereon;
    a guide member provided on said processing plate at a periphery of a substrate mounting area of said processing plate, which guides the substrate to said mounting area when the substrate is being placed on said processing plate;
    at least one temperature sensor disposed, within said mounting area, in said processing plate; and judging means for judging a mounting condition of the substrate based on a change in temperature, detected by said temperature sensor, caused by mounting of the substrate onto said processing plate, said judging means being configured to judge that the substrate rests on said guide member if an amount of change in the temperature is less than a predetermined value.

2. The apparatus as set forth in claim 1, further comprising:

means for giving an alarm when said judging means judges that the substrate rests on said guide member.

3. The apparatus as set forth in claim 1, wherein said guide member has a substantially vertical wall facing the substrate mounting area and having a height greater than one millimeter.

4. The apparatus as set forth in claim 1, wherein said judging means is configured to determine whether or not the amount of the change in the temperature is less than a predetermined value, by comparing a temperature, measured by said temperature sensor at a point of time after the substrate is mounted on said processing plate, with a judgmental-standard temperature.

5. The apparatus as set forth in claim 1, wherein said judging means is configured to determine whether or not the amount of the change in the temperature is less than a predetermined value, by comparing a temperature difference, between a first temperature measured at a first point of time after the substrate is mounted on said processing plate and a second temperature measured at a second point of time preceding the first point of time, with a judgmental-standard temperature difference.

6. The apparatus as set forth in claim 1, wherein the temperature sensor is disposed, at a position at a distance from a center of the substrate mounting area, in said processing plate;

said apparatus further comprising:

means for assuming a positional deviation of the substrate, mounted on said processing plate, from the substrate mounting area, based on the change in the temperature measured by said temperature sensor.

7. The apparatus as set forth in claim 1, wherein said apparatus is provided with a plurality of temperature sensors as said at least one temperature sensor, said apparatus further comprising:

means for assuming a positional deviation of the substrate, mounted on said processing plate, from the substrate mounting area, based on a comparison between the changes in the temperatures detected respectively by said plurality of temperature sensors.

8. The apparatus as set forth in claim 7, wherein said apparatus is provided with three or more temperature sensors arranged respectively at different positions within said substrate mounting area of said processing plate.

9. The apparatus as set forth in claim 1, further comprising:

a substrate carrying arm adapted to mount and remove the substrate onto and from said processing plate;

a controller that controls an operation of said carrying arm so that said carrying arm removes the substrate from said processing plate mounted on the processing plate and then mounts the removed substrate onto said processing plate again, if said judging means judges that the abnormal mounting of the substrate occurs.

10. A processing apparatus for performing a heat processing or a cooling processing for a substrate, comprising:

a processing plate adapted to heat or cool the substrate mounted thereon;

a guide member provided on said processing plate at a periphery of a substrate mounting area of said processing plate, which guides the substrate to said mounting area when the substrate is being placed on said processing plate;

a temperature sensor disposed, within said mounting area, in said processing plate; and judging means for judging a mounting condition of the substrate based on a change in temperature, detected by said temperature sensor, caused by mounting of the substrate onto said processing plate, said judging means being configured to judge that dust adheres to the substrate if an amount of change in the temperature is less than a predetermined value.

11. A processing apparatus for performing a heat processing or a cooling processing for a substrate, comprising:

a processing plate adapted to heat or cool the substrate mounted thereon;

a guide member provided on said processing plate at a periphery of a substrate mounting area of said processing plate, which guides the substrate to said mounting area when the substrate is being placed on said processing plate;

a temperature sensor disposed, within said mounting area, in said processing plate; and judging means for judging a mounting condition of the substrate based on a change in temperature, detected by said temperature sensor, caused by mounting of the substrate onto said processing plate, said judging means being configured to judge that an abnormal mounting of the substrate occurs if an amount of change in the temperature is less than a first value, and that dust adheres to the substrate if an amount of change in the temperature is less than a second value smaller than the first value.

12. A processing apparatus for performing a heat processing or a cooling processing for a substrate, comprising:

a processing plate adapted to heat or cool the substrate mounted thereon;

a guide member provided on said processing plate at a periphery of a substrate mounting area of said processing plate, which guides the substrate to said mounting area when the substrate is being placed on said processing plate;

a temperature sensor disposed, within said mounting area, in said processing plate;

judging means for judging a mounting condition of the substrate based on a change in temperature, detected by said temperature sensor, caused by mounting of the substrate onto said processing plate, said judging means being configured to judge that an abnormal mounting of the substrate occurs if an amount of change in the temperature is less than a predetermined value;

a plurality of pins, adapted to protrude from and retract into an upper face of said processing plate; and retracting means for making said pins protrude from the upper face of said processing plate and retract again into the upper face of said processing plate when said judging means judges that the abnormal mounting of the substrate occurs.

13. The apparatus as set forth in claim 12,
wherein said judging means is configured to judge that the substrate is defective or dust adheres to the substrate if an amount of a change in temperature, detected by said temperature sensor, caused by re-mounting of the substrate by protruding and retracting said pins, is less than a predetermined value.

14. A processing apparatus for performing a heat processing or a cooling processing for a substrate, comprising:
a processing plate adapted to heat or cool the substrate mounted thereon;
a guide member provided on said processing plate at a periphery of a substrate mounting area of said processing plate, which guides the substrate to said mounting area when the substrate is being placed on said processing plate;
a temperature sensor disposed, within said mounting area, in said processing plate;
judging means for judging a mounting condition of the substrate based on a change in temperature, detected by said temperature sensor, caused by mounting of the substrate onto said processing plate, said judging means being configured to judge that an abnormal mounting of the substrate occurs if an amount of change in the temperature is less than a predetermined value; and
means for giving vibration to said processing plate when judging means judges that the abnormal mounting of the substrate occurs.

15. The apparatus as set forth in claim 14,
wherein said processing plate is configured to perform a cooling processing for the substrate.

16. A processing system, comprising:
a plurality of processing apparatuses each including:
a processing plate adapted to heat or cool the substrate mounted thereon;
a guide member provided on said processing plate at a periphery of a substrate mounting area of said processing plate, which guides the substrate to said mounting area when the substrate is being placed on said processing plate;
a temperature sensor disposed, within said mounting area, in said processing plate; and
judging means for judging a mounting condition of the substrate based on a change in temperature, detected by said temperature sensor, caused by mounting of the substrate onto said processing plate, said judging means being configured to judge that an abnormal mounting of the substrate occurs if an amount of change in the temperature is less than a predetermined value;
a transfer device for transferring the substrate between said plurality of processing apparatuses; and
a system controller that selects any one of said processing apparatuses for processing a substrate, said system controller being configured so that, if said judging means of a first processing apparatus among said plurality of processing apparatuses judges that the abnormal mounting of a substrate in said first processing apparatus occurs, the system controller thereafter prohibits processing a substrate in said first processing apparatus and selects a processing apparatus other than said first processing apparatus to process a substrate.

17. The system as set forth in claim 16, wherein said system controller is configured so that, if said judging means of a first processing apparatus among said plurality of processing apparatuses judges that the abnormal mounting occurs at least twice consecutively, the system controller thereafter prohibits processing a substrate in said first processing apparatus and select a processing apparatus other than said first processing apparatus to process a substrate.

18. A processing system, comprising:
a plurality of processing apparatuses each including:
a processing plate adapted to heat or cool the substrate mounted thereon;
a guide member provided on said processing plate at a periphery of a substrate mounting area of said processing plate, which guides the substrate to said mounting area when the substrate is being placed on said processing plate;
a temperature sensor disposed, within said mounting area, in said processing plate; and
judging means for judging a mounting condition of the substrate based on a change in temperature, detected by said temperature sensor, caused by mounting of the substrate onto said processing plate, said judging means being configured to judge that an abnormal mounting of the substrate occurs if an amount of change in the temperature is less than a predetermined value;
a transfer device for transferring the substrate between said plurality of processing apparatuses; and
means for marking the substrate processed by one of said processing apparatuses when said judging means judges that the abnormal mounting of the substrate occurs in said one of said processing apparatus.

19. A method of judging a mounting condition of a substrate, said method comprising the steps of:
mounting a substrate on a processing plate configured to heat or cool the substrate and having a guide member at a periphery of a substrate mounting area of said processing plate;
measuring, after the substrate mounted on said processing plate, a temperature at a part of the substrate mounting area of said processing plate covered by the substrate;
determining an amount of change in temperature at the part caused by mounting of the substrate onto the processing plate;
comparing the amount of change in temperature with a judgmental-standard value; and
judging that the substrate rests on said guide member, if the amount of change in the temperature is less than the judgmental-standard value.

20. The method as set forth in claim 19, further comprising the steps of:
assuming a positional deviation of the substrate, mounted on said processing plate, from the substrate mounting area, based on the temperature at the part of the substrate mounting area.

21. The method as set forth in claim 20, further comprising the steps of:
measuring, after the substrate mounted on said processing plate, temperatures at a plurality of parts of the substrate mounting area of said processing plate covered by the substrate, wherein said assuming step assumes the positional deviation of the substrate based on differences between the temperatures.

* * * * *